(12) United States Patent
Gandrud

(10) Patent No.: US 7,011,113 B2
(45) Date of Patent: Mar. 14, 2006

(54) HYDRAULIC CARTRIDGE VALVE SOLENOID COIL FOR DIRECT MOUNT TO A PRINTED CIRCUIT BOARD

(75) Inventor: Michael D. Gandrud, Ames, IA (US)

(73) Assignee: SAuer-Danfoss Inc., Ames, IA (US)

( * ) Notice: Subject to any disclaimer, the term of this patent is extended or adjusted under 35 U.S.C. 154(b) by 139 days.

(21) Appl. No.: 10/793,164

(22) Filed: Mar. 4, 2004

(65) Prior Publication Data

US 2005/0194052 A1    Sep. 8, 2005

(51) Int. Cl.
F16K 11/10    (2006.01)
(52) U.S. Cl. ..................................... 137/884
(58) Field of Classification Search .............. 137/269, 137/270, 597, 884
See application file for complete search history.

(56) References Cited

U.S. PATENT DOCUMENTS

| 4,549,248 | A |  | 10/1985 | Stoll |  |
|---|---|---|---|---|---|
| 4,830,054 | A |  | 5/1989 | Feichtiger et al. |  |
| 4,928,730 | A |  | 5/1990 | Ando et al. |  |
| 5,452,948 | A |  | 9/1995 | Cooper et al. |  |
| 5,481,237 | A |  | 1/1996 | Sarfati et al. |  |
| 5,611,372 | A |  | 3/1997 | Bauer et al. |  |
| 5,806,565 | A |  | 9/1998 | Kadlicko |  |
| 5,992,461 | A |  | 11/1999 | Gilmore et al. |  |
| 6,060,797 | A |  | 5/2000 | Harris et al. |  |
| 6,095,489 | A |  | 8/2000 | Kaneko et al. |  |
| 6,148,862 | A | * | 11/2000 | Doll | 137/884 |
| 6,250,335 | B1 |  | 6/2001 | Ohishi et al. |  |
| 6,375,473 | B1 |  | 4/2002 | Schliche |  |
| 6,582,032 | B1 |  | 6/2003 | Haller |  |
| 6,619,142 | B1 | * | 9/2003 | Forster et al. | 137/884 |
| 6,662,825 | B1 | * | 12/2003 | Frank et al. | 137/884 |

FOREIGN PATENT DOCUMENTS

JP        404351386 A    12/1992

* cited by examiner

*Primary Examiner*—John Fox

(57) ABSTRACT

A hydraulic cartridge valve is provided that is moveably received within a manifold in fluid communication with a hydraulic unit, such as that which drives heavy machinery. The present invention comprises a solenoid coil secured to and operatively connected to the hydraulic cartridge valve. In addition, a circuit board is secured to and in electronic communication with the solenoid coil. A controller area network is electronically connected to the circuit board such that a computer controls the operation of the solenoid coil, thereby controlling the performance of the hydraulic cartridge valve. The solenoid coil is secured to the cartridge valve by a securing nut and has a plurality of pins for directly mounting the coil to the circuit board.

15 Claims, 2 Drawing Sheets

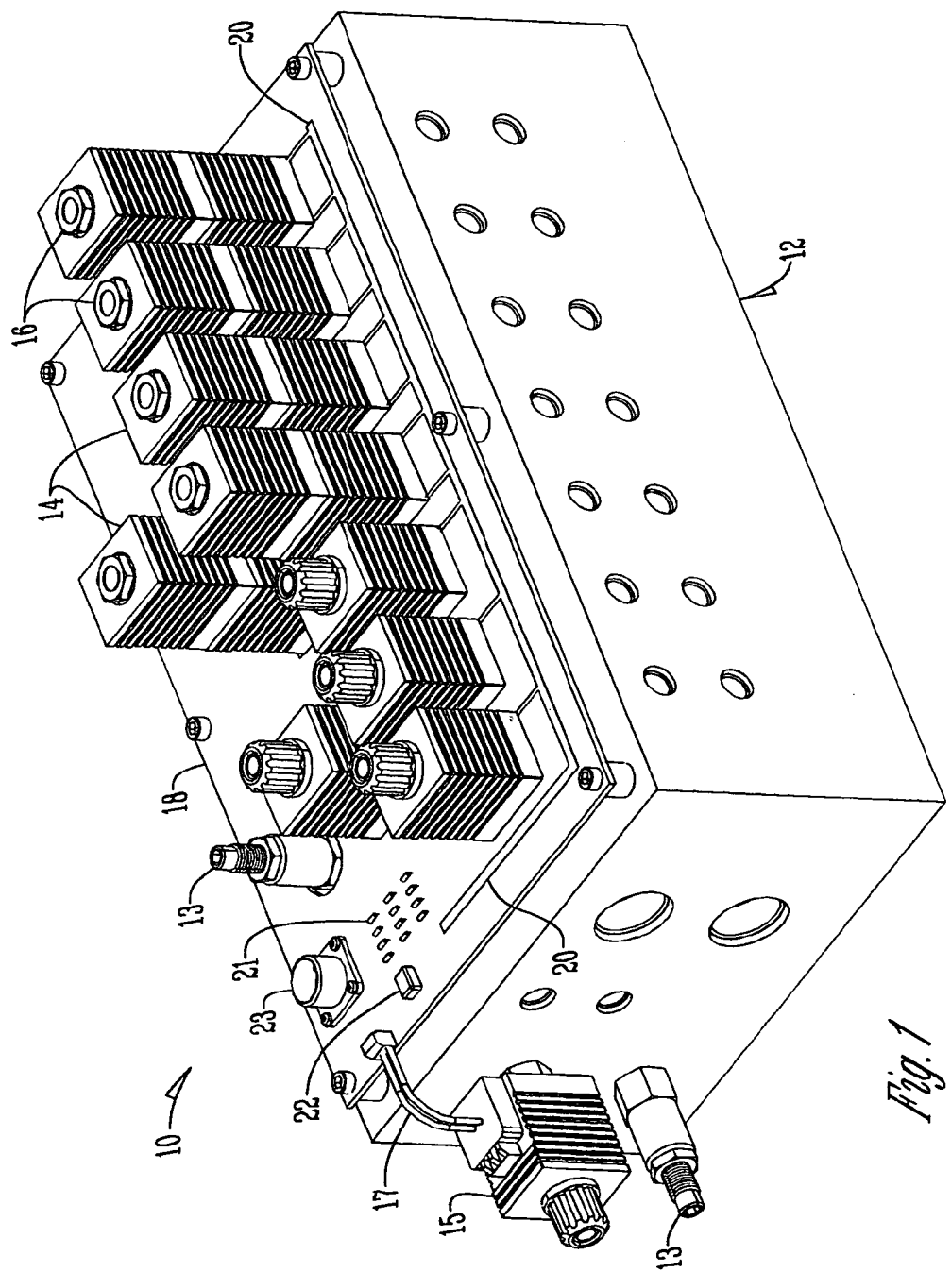

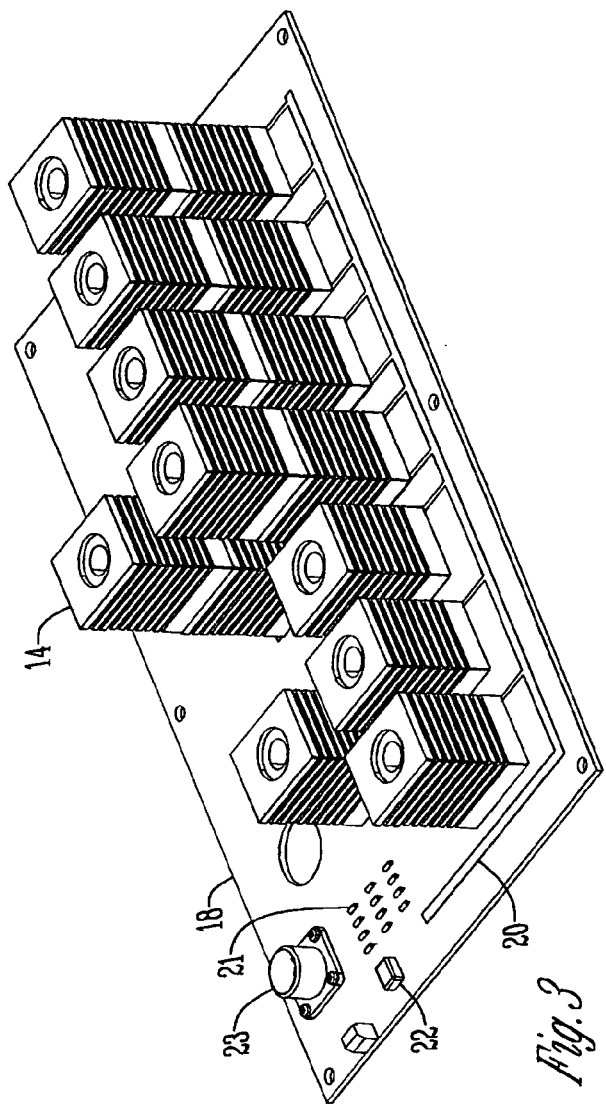
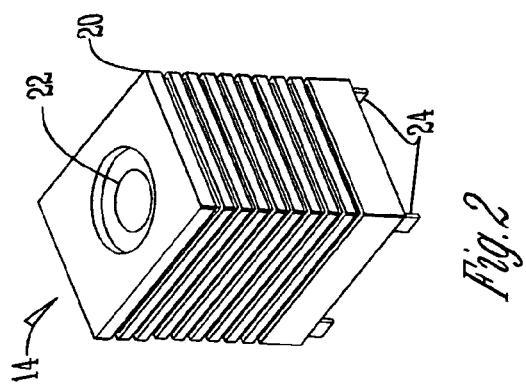

HYDRAULIC CARTRIDGE VALVE SOLENOID COIL FOR DIRECT MOUNT TO A PRINTED CIRCUIT BOARD

BACKGROUND OF THE INVENTION

The present invention relates to a solenoid operated hydraulic cartridge valve and, more specifically, to a solenoid coil directly mounted to a printed circuit board for controlling the hydraulic cartridge valve.

Hydraulic cartridge valves are commonly used in hydraulic systems for controlling the flow of hydraulic fluid through such systems in order to affect the operation of heavy machinery, such as construction machines, driven by a hydraulic system. Typically, a cartridge valve is moveably received within a bore in a manifold in fluid communication with the hydraulic system such that the bore serves as the housing for the valve. In a typical hydraulic system, a manifold contains several cartridge valves. Each cartridge valve is controlled by at least one solenoid coil, which is energized by a control system to shift the cartridge valve into one of a plurality of positions, such as an open position or a closed position. Some cartridge valves operate in an analog manner where the valve position is a linear function of the electrical signal applied.

Conventional control systems use cables, wire harnesses, and other types of hard wiring to electronically connect the solenoid coils to the controllers. These wire harnesses consist of multiple leads running to each coil. On a typical manifold with multiple cartridge valves, dozens of wires must run from the controller to the solenoid coils in order to effectively operate and control the cartridge valves. These cables are bulky and consume considerable physical space on a typical hydraulic powered machine. As a complicated system component, these cables and wire harnesses are costly and labor intense components to produce and suffer from poor reliability. Attempts to improve the reliability of wire harnesses lead to still greater cost increases.

It is therefore a principal object of this invention to provide a control system for hydraulic cartridge valves that conserves space and allows for greater control of the cartridge valves.

It is another object of the present invention to provide a system for the effective electrical connection of hydraulic cartridge valve solenoids at a reduced cost over methods of the present art.

A further object of this invention is to provide solenoid coils for controlling the cartridge valves that secure to a circuit board to allow electronic control of the cartridge valves.

Yet a further object of the present invention is to provide a method of electrically connecting hydraulic cartridge valves with improved reliability.

These and other objects will be apparent to those skilled in the art.

BRIEF SUMMARY OF THE INVENTION

The present invention is directed towards a hydraulic cartridge valve that is moveably received within a manifold in fluid communication with a hydraulic unit, such as that which drives heavy machinery. The present invention comprises a solenoid coil secured to and operatively connected to the hydraulic cartridge valve. In addition, a circuit board is secured to and in electronic communication with the solenoid coil. Solenoid coils which are known in the art function by producing a magnetic field when an electrical current is applied. A Controller Area Network (CAN) circuit is electronically connected to the circuit board such that the CAN circuit is able to receive and interpret network signals and commands for the operation of valves and related components and control the operation of the solenoid coil, thereby controlling the performance of the hydraulic cartridge valve. Solenoid coils of the present invention are optionally secured to the cartridge valve by a securing nut and have a plurality of pins for directly mounting the coil to the circuit board. Alternative geometries for the circuit board connecting electrical appendage are contemplated without limit. In the present invention, these pins provide an electrical connection to the wire coil contained within the coil housing, and also provide for mounting. These pins are optionally soldered to the circuit board in order to establish both the needed electrical and mechanical connections to the circuit board easily and at minimal cost.

BRIEF DESCRIPTION OF THE DRAWINGS

FIG. 1 is perspective view of a manifold with a solenoid coil directly mounted to a printed circuit board of the present invention;

FIG. 2 is a perspective view of the solenoid coil of the present invention; and

FIG. 3 is a perspective view of a circuit board with attached solenoid coils of the present invention.

DETAILED DESCRIPTION OF THE INVENTION

With reference to FIG. 1, a hydraulic unit 10 is shown with a manifold block 12 in fluid communication with the hydraulic unit 10 and housing a plurality of conventional hydraulic cartridge valves. The hydraulic unit 10 includes a plurality of solenoid coils 14 that are optionally secured to the hydraulic cartridge valves by securing nuts 16. The hydraulic unit 10 further includes a printed circuit board 18 secured to the solenoid coils 14. Those skilled in the art will appreciate that the solenoid coils may be attached by means other than nuts such as by attachment to a mounted circuit board, or alternatively by a pressure plate which secures a plurality of solenoid coils to their respective valve stems.

The manifold block 12, which commonly is made of aluminum or other metals, incorporates several hydraulic cartridge valves that are used to control the flow of hydraulic fluid flowing therein. The hydraulic manifold also may include non-solenoid type cartridge valves 13, and solenoid type cartridge valves of the conventional design 15. Such valves of the conventional design would be connected to the control circuit with wires 17 of the standard design.

Solenoid coil 14, as shown in FIG. 2, consists of a housing 20 that encases a wire coil (not shown). Solenoid coil 14 further includes a through hole 22 for receiving the hydraulic cartridge valve for securing the solenoid coil 14 to the cartridge valve. Specifically, the solenoid coil 14 is fitted over a valve stem (not shown) of the hydraulic cartridge valve extending from the manifold 12 such that the hydraulic cartridge valve engages with through hole 22 of the solenoid coil 14. The securing nut 16 is then fastened to the valve stem to secure the solenoid coil 14 to the cartridge valve. Solenoid coil 14 also includes a plurality of pins 24 that are connected to the wire coil of the solenoid 14 and allow both electrical and mechanical connection of the solenoid 14 to the circuit board 18. As such, solenoid coil 14 uses pins 24 to directly mount to circuit board 18. As solenoid coils 14 typically are manufactured with a wire coil comprised of a set number of windings necessary to operate at a specific voltage, the present invention allows for the use of multiple solenoid coils 14 plugged into or optionally soldered to the circuit board 18 in either a series or parallel configuration. For example, two solenoid coils 14 designed to operate at 12V may be connected in series to accommodate a system designed to operate at 24V. Coils are optionally operated individually when dictated by the manifold requirements.

Circuit board 18 is a conventional printed circuit board that is adapted to receive the pins 24 of solenoid coil 14. Circuit board 18 also may be connected to a remote control circuit through an electrical connector 23. Alternately, the circuit board may further include an electronic controller or micro controller circuit 22. This controller circuit may optionally be designed to receive and transmit commands through a Controller Area Network (CAN) network, thereby controlling the desired control state for each solenoid coil. The circuit board 18 further incorporates printed circuit traces 20 which connect the pins 24 of the coils 14 with ground wires and optionally with control wires of the attached microcontroller circuit. As such, an electronic control system, acting through the circuit board 18, controls solenoid coil 14, thereby controlling the hydraulic cartridge valve.

In practice, a solenoid coil 14 is secured to a circuit board 18 for use in controlling a hydraulic cartridge valve housed within manifold 12 of a hydraulic unit 10. A computerized control system connected to the circuit board 18 sends control signals through circuit board 18 to energize the solenoid coil 14, thereby shifting the cartridge valve to an open or closed position or to a desired point therebetween.

Those skilled in the art will appreciate that additional electrical and sensing components may optionally be attached to the circuit board 18. For example, a pressure sensor, pressure switch, temperature sensor, transistor, pulse width modulation amplifier, and other components are possible.

Further, those skilled in the art also will recognize that the present invention may be used with "rigid" circuit boards such as boards composed of FR4 material. In the same manner, this present invention will also work with flexible circuit boards of various types.

It is therefore seen that by the use of a solenoid coil directly mounted to a circuit board, this invention permits hydraulic cartridge valves to be controlled by a computerized or other electrical controller without the need for bulky cables and hard wiring.

What is claimed is:

1. A hydraulic unit comprising:
    a manifold in fluid communication with the hydraulic unit;
    a plurality of hydraulic cartridge valves moveably received within the manifold;
    a circuit board; and
    solenoid coils secured to the circuit board and operatively connected to the cartridge valves to permit the cartridge valves to be controlled by the solenoid coils;
    wherein at least one solenoid coil has a through hole for receiving at least one hydraulic cartridge valve for securing the solenoid coil to the cartridge valve; and
    further comprising
    a computer in electronic communication with the circuit board wherein the computer controls the operation of the solenoid coil.

2. The hydraulic unit of claim 1 wherein a computer is connected to the circuit board via a controller area network.

3. The hydraulic unit of claim 1 wherein the solenoid coils have a plurality of pins for directly mounting the coils to the circuit board.

4. The hydraulic unit of claim 1 further comprising securing nuts for securing the solenoid coils to the cartridge valves.

5. The hydraulic unit of claim 1 wherein the circuit board incorporates at least one electrical connector.

6. The hydraulic unit of claim 1 further comprising a controller area network circuit.

7. The hydraulic unit of claim 1 wherein a pressure sensor is connected to the circuit board.

8. The hydraulic unit of claim 1 wherein a pressure switch is connected to the circuit board.

9. The hydraulic unit of claim 1 wherein a temperature sensor is connected to the circuit board.

10. The hydraulic unit of claim 1 wherein a transistor is connected to the circuit board.

11. A hydraulic cartridge valve moveably received within a manifold in fluid communication with a hydraulic unit comprising:
    a solenoid coil secured to and operatively connected to the cartridge valve; and
    a circuit board secured to and in electronic communication with the solenoid coil wherein the solenoid coil has a through hole for receiving the hydraulic cartridge valve for securing the solenoid coil to the cartridge valve comprising
    a computer in electronic communication with the circuit board wherein the computer controls the operation of the solenoid coil.

12. The device of claim 11 wherein the computer is connected to the circuit board via a controller area network circuit.

13. The device of claim 11 wherein the solenoid coil has a plurality of pins for directly mounting the coil to the circuit board.

14. The device of claim 11 further comprising a securing nut for securing the solenoid coil to the cartridge valve.

15. A solenoid coil for controlling a hydraulic cartridge valve comprising:
    a housing to receive a wire coil;
    a plurality of pins connected to the wire coil for securing the solenoid coil to a circuit board;
    means for securing the solenoid coil to the hydraulic cartridge valve wherein the solenoid coil has a through hole for receiving the hydraulic cartridge valve for securing the solenoid coil to the cartridge valve;
    wherein the circuit board incorporates micro controller;
    wherein the micro controller is operatively connected to at least one external device through an electronic networking connection; and
    wherein the network is a controller area network.

* * * * *